United States Patent
Xie et al.

(10) Patent No.: US 11,495,456 B2
(45) Date of Patent: Nov. 8, 2022

(54) OZONE FOR SELECTIVE HYDROPHILIC SURFACE TREATMENT

(71) Applicants: Mattson Technology, Inc., Fremont, CA (US); Beijing E-Town Semiconductor Technology, Co., LTD, Beijing (CN)

(72) Inventors: Ting Xie, Fremont, CA (US); Xinliang Lu, Fremont, CA (US); Hua Chung, Saratoga, CA (US); Michael X. Yang, Palo Alto, CA (US)

(73) Assignees: BEIJING E-TOWN SEMICONDUCTOR TECHNOLOGY, CO., LTD, Beijing (CN); MATTSON TECHNOLOGY, IN, Fremont, CA (US)

( * ) Notice: Subject to any disclaimer, the term of this patent is extended or adjusted under 35 U.S.C. 154(b) by 235 days.

(21) Appl. No.: 16/589,270

(22) Filed: Oct. 1, 2019

(65) Prior Publication Data

US 2020/0118813 A1   Apr. 16, 2020

Related U.S. Application Data

(60) Provisional application No. 62/745,523, filed on Oct. 15, 2018.

(51) Int. Cl.
 *C23C 16/02* (2006.01)
 *H01L 21/02* (2006.01)
 (Continued)

(52) U.S. Cl.
 CPC .... *H01L 21/02271* (2013.01); *C23C 16/0218* (2013.01); *C23C 16/50* (2013.01); *C23C 16/458* (2013.01); *C23C 2222/00* (2013.01)

(58) Field of Classification Search
 None
 See application file for complete search history.

(56) References Cited

U.S. PATENT DOCUMENTS

| | | |
|---|---|---|
| 4,885,067 A | 12/1989 | Doty |
| 5,275,798 A | 1/1994 | Aida |

(Continued)

FOREIGN PATENT DOCUMENTS

| | | |
|---|---|---|
| KR | 10-0777043 | 11/2007 |
| WO | WO 2010-045153 | 4/2010 |

(Continued)

OTHER PUBLICATIONS

International Preliminary Report on Patentability for Application No. PCT/US2019/054022, dated Apr. 30, 2021, 6 pages.

(Continued)

*Primary Examiner* — David P Turocy
(74) *Attorney, Agent, or Firm* — Dority & Manning, P.A.

(57) ABSTRACT

Processes for surface treatment of a workpiece are provided. In one example implementation, a method can include placing the workpiece on a workpiece support in a processing chamber. The method can include admitting a process gas into the processing chamber. The process gas can include an ozone gas. The method can include exposing the silicon nitride layer and the low-k dielectric layer to the process gas to modify a surface wetting angle of the silicon nitride layer.

17 Claims, 7 Drawing Sheets

(51) Int. Cl.
*C23C 16/50* (2006.01)
*C23C 16/458* (2006.01)

(56) References Cited

U.S. PATENT DOCUMENTS

| | | | |
|---|---|---|---|
| 5,811,022 | A | 9/1998 | Savas et al. |
| 6,028,015 | A | 2/2000 | Wang |
| 6,107,197 | A | 8/2000 | Suzuki |
| 6,251,804 | B1* | 6/2001 | Chen .................. H01L 21/3105 |
| | | | 257/E21.301 |
| 6,559,070 | B1 | 5/2003 | Mandal |
| 6,677,251 | B1 | 1/2004 | Lu |
| 7,071,077 | B2 | 7/2006 | Maleville et al. |
| 7,541,200 | B1 | 6/2009 | Schravendijk et al. |
| 7,604,708 | B2 | 10/2009 | Wood et al. |
| 7,807,579 | B2 | 10/2010 | Yang |
| 7,901,743 | B2 | 3/2011 | Lee et al. |
| 8,158,534 | B2 | 4/2012 | Yokonaga |
| 8,821,987 | B2 | 9/2014 | Shanker |
| 9,214,319 | B2 | 12/2015 | Nagorny et al. |
| 9,837,270 | B1 | 12/2017 | Varadarajan |
| 9,893,160 | B2 | 2/2018 | Yao et al. |
| 10,269,574 | B1 | 4/2019 | Yang |
| 11,043,393 | B2 | 6/2021 | Wang et al. |
| 2001/0023051 | A1* | 9/2001 | Rolfson ............ H01L 21/02271 |
| | | | 430/311 |
| 2002/0006478 | A1* | 1/2002 | Yuda ....................... C23C 16/52 |
| | | | 427/255.27 |
| 2003/0035904 | A1* | 2/2003 | Hsieh ................... H01L 21/312 |
| | | | 257/E21.259 |
| 2003/0042465 | A1 | 3/2003 | Ko |
| 2003/0134051 | A1 | 7/2003 | Jung et al. |
| 2004/0154743 | A1 | 8/2004 | Savas |
| 2006/0081273 | A1 | 4/2006 | McDermott |
| 2007/0054501 | A1 | 3/2007 | Carman et al. |
| 2007/0072422 | A1 | 3/2007 | Yeh |
| 2007/0190266 | A1 | 8/2007 | Fu |
| 2008/0261405 | A1 | 10/2008 | Yang |
| 2008/0299739 | A1* | 12/2008 | Yoshizawa .......... H01L 21/3144 |
| | | | 438/424 |
| 2009/0274610 | A1 | 11/2009 | Ghoanneviss et al. |
| 2010/0025667 | A1 | 2/2010 | Liu et al. |
| 2010/0127269 | A1* | 5/2010 | Daniel .............. H01L 29/78684 |
| | | | 257/66 |
| 2011/0097904 | A1* | 4/2011 | Sirard ............... H01L 21/76814 |
| | | | 438/719 |
| 2011/0117751 | A1 | 5/2011 | Sonthalia |
| 2012/0135612 | A1 | 5/2012 | Matsumoto et al. |
| 2012/0270339 | A1 | 10/2012 | Xie et al. |
| 2012/0285481 | A1 | 11/2012 | Lee et al. |
| 2013/0034968 | A1 | 2/2013 | Zhang et al. |
| 2014/0113532 | A1 | 4/2014 | Smith |
| 2014/0261186 | A1 | 9/2014 | Cho |
| 2015/0108493 | A1 | 4/2015 | Kang |
| 2015/0126027 | A1 | 5/2015 | Matsumoto |
| 2015/0239759 | A1 | 8/2015 | Kang |
| 2015/0303065 | A1 | 10/2015 | Buckalew |
| 2016/0020089 | A1 | 1/2016 | Thadani |
| 2016/0260616 | A1 | 9/2016 | Li et al. |
| 2016/0276134 | A1 | 9/2016 | Collins |
| 2018/0166330 | A1* | 6/2018 | Ch .................... H01L 21/31144 |
| 2018/0205026 | A1* | 7/2018 | Zhou ................... H01L 51/0003 |
| 2019/0362965 | A1* | 11/2019 | Wong ...................... H01L 23/29 |
| 2020/0035882 | A1* | 1/2020 | Brodoceanu ..... B29D 11/00298 |

FOREIGN PATENT DOCUMENTS

| | | |
|---|---|---|
| WO | WO 2017/147365 | 8/2017 |
| WO | WO 2019/145485 A1 | 8/2019 |

OTHER PUBLICATIONS

Bao et al., "Mechanistic Study of Plasma Damage and CH4 Recovery of Low κ Dielectric Surface," 2007 IEEE International Interconnect Technology Conference, Jun. 4-6, 2007, pp. 1-3.

"HMDS," Retrieved from the internet May 17, 2018, https://www.microchemicals.com/products/adhesion_promotion/hmds.html—2 pages.

PCT International Search Report and Written Opinion for corresponding PCT Application No. PCT/US2019/054022, dated Jan. 28, 2020, 10 pages.

* cited by examiner

OZONE FOR SELECTIVE HYDROPHILIC SURFACE TREATMENT

PRIORITY CLAIM

The present application claims the benefit of priority of U.S. Provisional Application Ser. No. 62/745,523, filed on Oct. 15, 2018, titled "Ozone for Selective Hydrophilic Surface Treatment," which is incorporated herein by reference.

FIELD

The present disclosure relates generally to surface treatment of workpieces, such as semiconductor workpieces.

BACKGROUND

The processing of semiconductor workpieces can involve the deposition and removal of different materials layers on a substrate. Device dimension and materials thickness continue to decrease in semiconductor processing with shrinking critical dimensions in semiconductor devices. In advanced nodes, materials surface properties and interface integrity can become increasingly important to semiconductor device performance. Surface hydrophilicity can be of particular importance as it affects the adhesion of the surface to the next applied layer of materials.

SUMMARY

Aspects and advantages of embodiments of the present disclosure will be set forth in part in the following description, or may be learned from the description, or may be learned through practice of the embodiments.

One example aspect of the present disclosure is directed to a method for surface treatment of a workpiece. The workpiece can include a first layer and a second layer. The method can include placing the workpiece on a workpiece support in a processing chamber. The method can include admitting a process gas into the processing chamber. The process gas can include an ozone gas. The method can include exposing first layer and the second layer to the process gas to modify a surface wetting angle of the first layer.

Other example aspects of the present disclosure are directed to systems, methods, and apparatus for surface treatment of workpieces.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
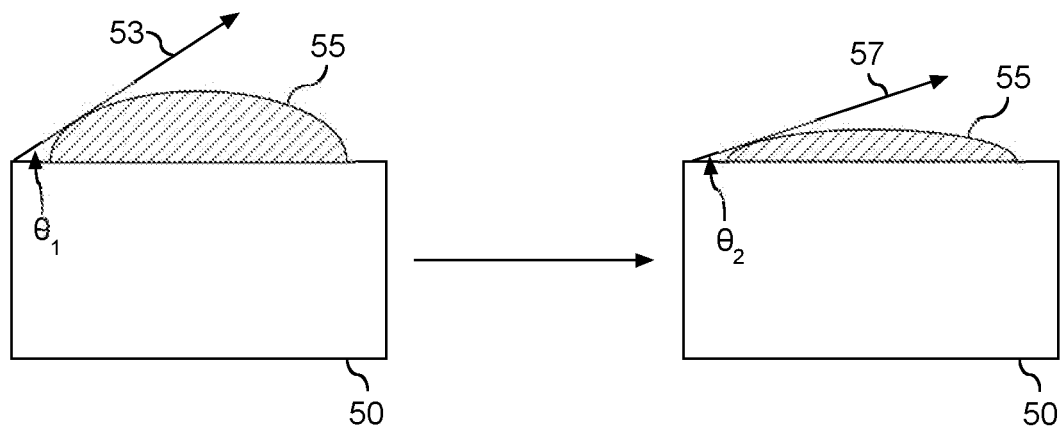
FIG. 1 depicts example modification of a surface wetting angle according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to surface treatment processes to affect hydrophilicity of workpieces, such as semiconductor workpieces of a semiconductor material, such as semiconductor wafers. Surface hydrophilicity can be important in workpiece processing as it can affect the adhesion of an applied layer of material to a surface of the workpiece. Surface hydrophilicity can be treated, for instance, by processes that involve wet chemistry and/or plasma treatments (e.g., exposure to radicals generated in a plasma). However, these treatments can be difficult to implement when processing very thin layers. For example, controlling materials selectivity (e.g., silicon nitride layer versus a low-k dielectric layer) for hydrophilicity treatment can be difficult. As another example, controlling treatment depth can be difficult. Moreover, wet chemistry treatment methods can be more expensive relative to dry treatment methods due to costs of chemicals and less precision control.

Example aspects of the present disclosure are directed to surface treatment processes that can provide the selective treatment of workpiece layers to adjust surface hydrophilicity. For instance, the surface treatment processes can be implemented to adjust the surface hydrophilicity of a silicon nitride (e.g., $Si_3N_4$) layer of a workpiece relative to other layers on the workpiece, such as a low-k dielectric material (e.g., an SiOC layer).

In some embodiments, a dry ozone gas can be exposed to the workpiece to reduce a surface wetting angle of the silicon nitride surface while maintaining the surface wetting angle of the low-k dielectric material mostly unchanged (e.g., less than about 5° change in surface wetting angle). Exposing the workpiece to the ozone gas can cause the ozone gas to act as an oxidizing agent to terminate the very top surface of a silicon nitride layer or film with oxygen, converting a surficial Si bond to an Si—O bond to improve the surface hydrophilicity of the silicon nitride layer. However, the surface hydrophilicy of other layers/materials on the workpiece, such as low-k dielectric layers, can remain relatively unchanged. This can facilitate deposition of additional layers (e.g., photoresist layers) on the workpiece after surface treatment.

In this way, example aspects of the present disclosure can provide a number of technical effects and benefits. For instance, surface treatment processes according to example aspects of the present disclosure can provide well-controlled selective surface treatment via a dry process that can be used as critical dimensions continue to shrink in the semiconductor processing industry.

Aspects of the present disclosure are discussed with reference to a "workpiece" or "wafer" for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within ten percent (10%) of the stated numerical value. A "pedestal" refers to any structure that can be used to support a workpiece. A low-k dielectric material can have a dielectric constant of less than about 3.0, such as less than about 2.5, such as less than about 2.2.

FIG. 1 depicts an example layer 50 that can be associated with a workpiece of a semiconductor material, such as a semiconductor wafer. The layer 50 can be, for instance, a silicon nitride layer. A material 55 (e.g., photoresist) can be deposited on the layer 50. The material 55 can have hydrophilic properties such that the material has a surface wetting angle $\theta_1$. The surface wetting angle $\theta_1$ (e.g., contact angle) can be defined as illustrated in FIG. 1 as an angle of the liquid-vapor interface line 53 relative to the top surface of layer 50. As shown in FIG. 1, an ozone based hydrophilic surface treatment processes can be performed on the layer 50 according to example aspects of the present disclosure to adjust the surface wetting angle of the material 55 from $\theta_1$ to $\theta_2$. In this case, the surface wetting angle $\theta_2$ is less than the surface wetting angle $\theta_1$, meaning that the material 55 is more easily distributed across the top surface of layer 50.

Figure 2:
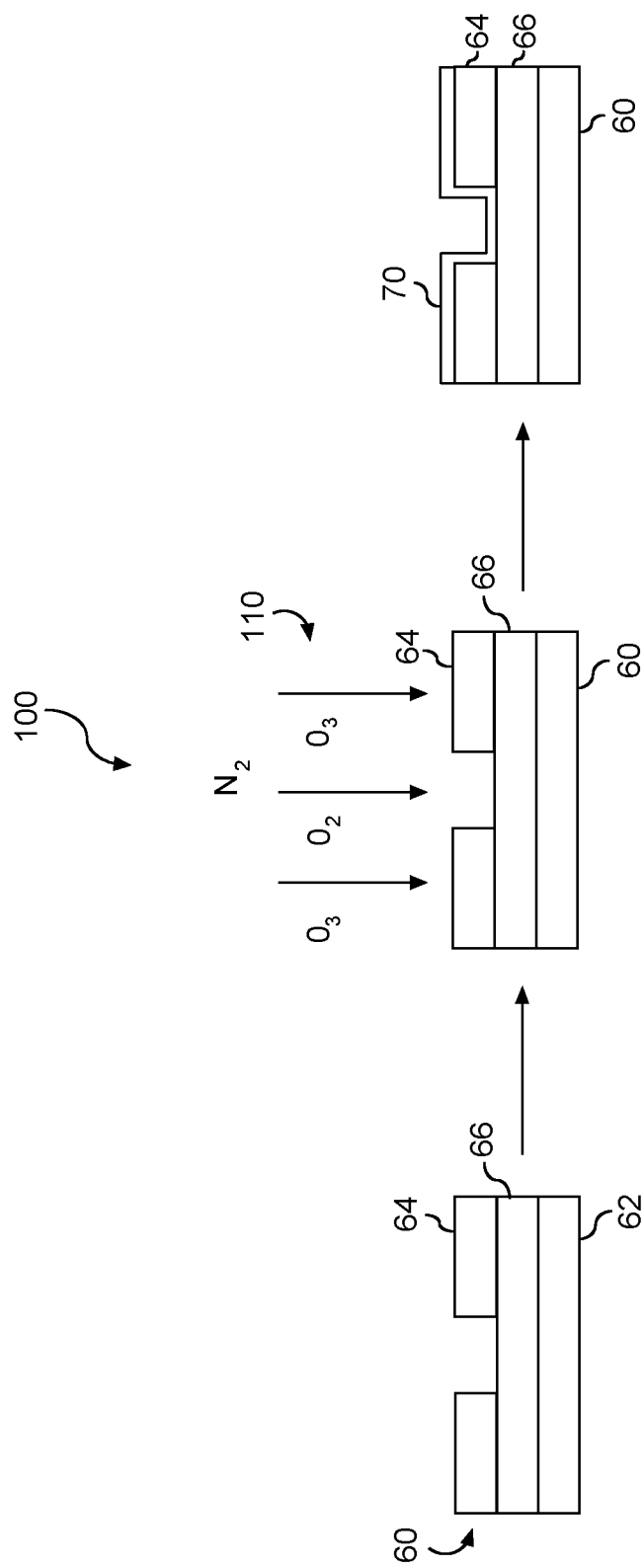
FIG. 2 depicts an overview of an example surface treatment process according to example embodiments of the present disclosure.

FIG. 2 depicts an overview of an example ozone based hydrophilic surface treatment process 100 that can be performed on a workpiece 60 according to example aspects of the present disclosure. As shown, a workpiece 60 can include a substrate layer 62 (e.g., silicon substrate layer) and a silicon nitride layer 64. The workpiece can also include low-k dielectric layer 66 (e.g., SiOC layer). It can be desirable to adjust a surface wetting angle of the silicon nitride layer without affecting properties of the low-k dielectric layer 64 to facilitate deposition of additional layers (e.g., photoresist layers) on the workpiece 60.

As shown in FIG. 2, the surface treatment process 100 can include exposing workpiece 60, including the silicon nitride layer 64 and the low-k dielectric layer 66 to a process gas. The process gas can include an ozone gas ($O_3$ gas). In some embodiments, the process gas can include an oxygen gas ($O_2$ gas). In some embodiments, the process gas can include a carrier gas, such as nitrogen or an inert gas (e.g., argon, helium, etc.)

Example process parameters for one example ozone based hydrophilic surface treatment process are provided below:

Workpiece processing temperature: about 25° C. to about 500° C.
Process Gas: $O_3$, $O_2$, and $N_2$
Concentration of Ozone Gas: about 0.1% by weight to 20% by weight
Concentration of $O_2$ gas: about 80% by weight to about 99.9% by weight
Concentration of $N_2$ gas: about 10 ppm to 1000 ppm
Processing Period: about 5 seconds to about 600 seconds The present inventors have discovered that exposing the workpiece 60 to an ozone gas can adjust the surface wetting angle of the silicon nitride layer 64 without affecting the surface wetting angle of the low-k dielectric layer 66 to a great extent (e.g., less than about 5° change in surface wetting angle). In other words, exposing the workpiece 60 to the ozone gas modifies the surface wetting angle of the silicon nitride layer 64 to a greater degree relative to the low-k dielectric layer 66. In this way, exposing the workpiece 60 to the ozone gas can be used to implement a selective surface treatment process to modify hydrophilicity of the silicon nitride layer selectively relative to the low-k dielectric layer.

In one example, it has been shown that exposing a silicon nitride layer to ozone gas can modify the surface wetting angle of the silicon nitride layer from about 20° to about 0°. However, the modification of the surface wetting angle of the low-k dielectric layer can be less than about 4°.

After the surface treatment process 100 has been implemented, additional layers can be deposited on the workpiece 60. For instance, as shown in FIG. 2, a photoresist layer 70 can be deposited on the workpiece 60. As a result of the surface treatment process 100, the photoresist layer 70 can be better deposited across the silicon nitride layer 64 as a result of modification of the hydrophilic properties of the silicon nitride layer 64.

Aspects of the present disclosure are discussed with respect to selective treatment of a silicon nitride layer and a low-k dielectric layer for purposes of illustration and discussion. In some embodiments, the surface treatment process can be implemented on workpieces with different types of layers without deviating from the scope of the present disclosure.

Figure 3:
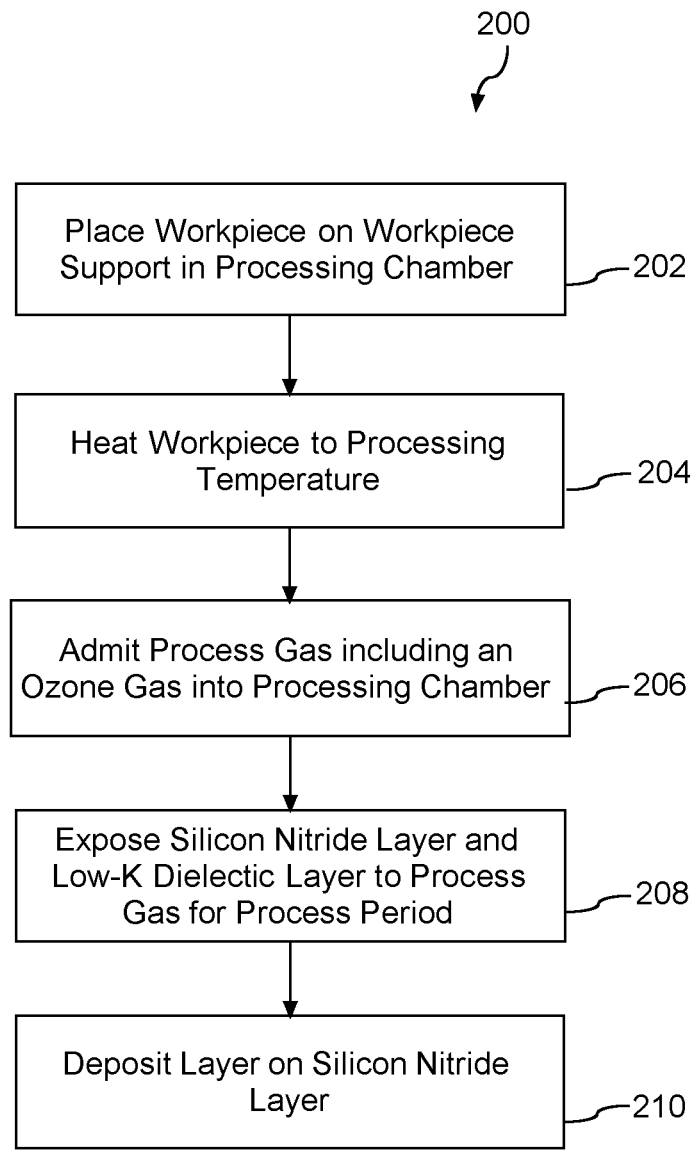
FIG. 3 depicts a flow diagram of an example method according to example embodiments of the present disclosure.

FIG. 3 depicts a flow diagram of an example method associated with an ozone-based surface treatment process (200) according to example aspects of the present disclosure. The ozone-based surface treatment process (200) can be implemented in a processing apparatus, such as any of the processing apparatus described herein. However, as will be discussed in detail below, the ozone-based surface treatment processes according to example aspects of the present disclosure can be implemented using other approaches without deviating from the scope of the present disclosure. FIG. 3 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (202), the method can include placing a workpiece on a workpiece support (e.g., pedestal) in a processing chamber. The workpiece can be a semiconductor wafer. In some embodiments, the workpiece can include a silicon nitride layer and a low-k dielectric layer.

Figure 4:
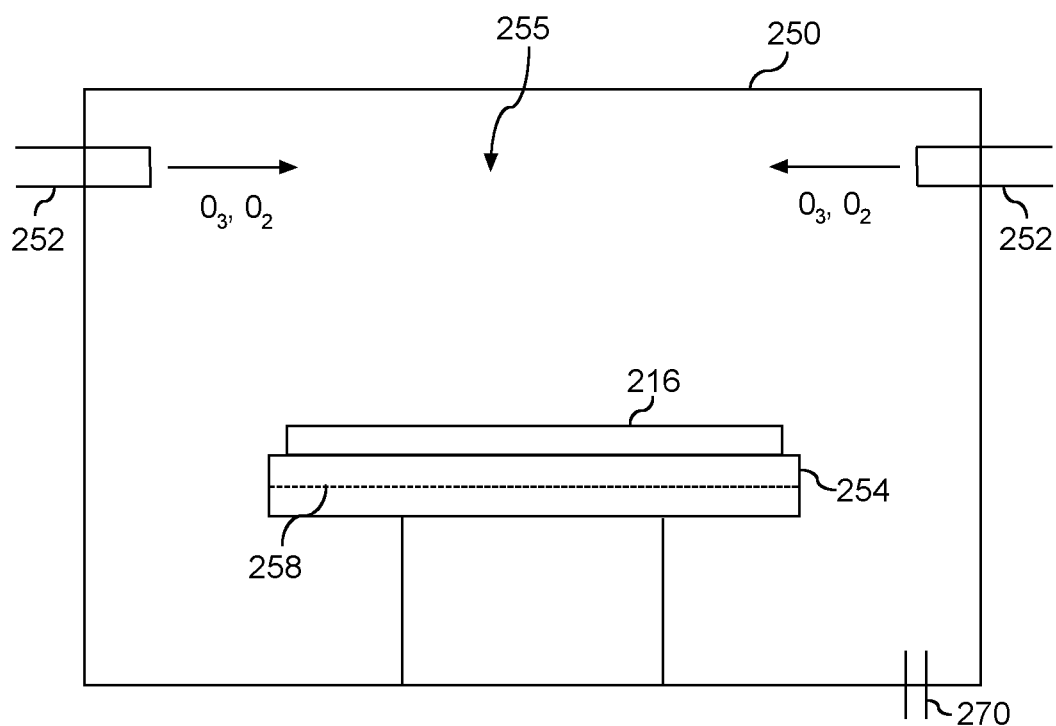
FIG. 4 depicts an example processing chamber configured to implement a surface treatment process according to example embodiments of the present disclosure.

FIG. 4 depicts an example processing chamber 250 that can be used to implement the method (200) according to example aspects of the present disclosure. The processing chamber 250 can include an interior volume 255 configured to accommodate a workpiece 216. The workpiece 216 can be supported on workpiece support 254.

At (204) of FIG. 3, the method can include heating the workpiece to a process temperature. The process temperature can be in the range of about 25° C. to about 500° C., such as about 150° C. to about 500° C. For example, referring to FIG. 4, the workpiece can be heated using a temperature regulation system 258 associated with the workpiece support 254. The temperature regulation system 258 can include heating elements (e.g., electrically resistive heating elements) disposed on the workpiece support 254. In some embodiments, the temperature regulation system 258 can include one or more fluid channels operable to circulate a fluid through the workpiece support 254 to heat or cool the workpiece 216. Other suitable heat sources can be used without deviating from the scope of the present disclosure, such as lamp heat sources, lasers, plasma heat sources, etc.

In some embodiments, a control system can regulate the temperature of the workpiece to a temperature setpoint. For instance, one or more sensors (e.g., pyrometers, temperature sensors, etc.) can be used to provide signals indicative of the temperature of the workpiece during the surface treatment process. The temperature regulation system 258 can heat and/or cool the workpiece based on the signals indicative of the temperature of the workpiece to regulate the temperature of the workpiece to the temperature setpoint.

At (206) of FIG. 3, the method can include admitting a process gas into the processing chamber. According to example aspects of the present disclosure, the process gas can include an ozone gas ($O_3$ gas). In some embodiments, the process gas can additionally include an oxygen gas ($O_2$ gas). In some embodiments, the process gas can additionally include a carrier gas, such as a nitrogen gas or inert gas. In some embodiments, the concentration of ozone gas in the process gas can be in the range of 0.1% by weight to 20% by weight, such as in the range of 0.5% by weight to 5% by weight.

FIG. 4 depicts example gas injection ports 252 that can be used to admit the process gas into the processing chamber interior 255. Other suitable methods and/or apparatus can be used to admit the process gas into the process chamber without deviating from the scope of the present disclosure. For instance, the process gas can be admitted via a showerhead or other suitable gas injection source.

At (208) of FIG. 3, the method can include exposing the silicon nitride layer and the low-k dielectric layer on the workpiece to the process gas, including the ozone gas, for a process period. The process period is the time the gas is exposed to the workpiece. In some embodiments, the process period can be in the range of about 5 seconds to about 600 seconds. In some embodiments, the process period can be in the range of about 30 seconds to about 90 seconds. After the process period the process gas can be evacuated from the process chamber (e.g., using a pump port 270).

In some embodiments, (206) and (208) can be implemented in a pulsed mode. In a pulsed mode, the process gas can be admitted and exposed to the workpiece and purged from the processing chamber in one or more pulses. For instance, the process gas can be exposed to the workpiece for a first pulse period (e.g., about 1 second or less), then purged from the processing chamber. The process gas can then be readmitted into the chamber and exposed to the workpiece for a second pulse period (e.g., about 1 second or less), then purged from the processing chamber. The pulses can occur at regular and/or irregular intervals. The pulses can be repeated until a desired surface wetting angle is achieved. This can allow for implementation of the surface treatment process using an ozone gas and/or oxygen gas with reduced surface oxidation.

At (210) of FIG. 3, the method can include performing additional processes after the surface treatment process. For instance, the method can include depositing a layer on the silicon nitride layer and/or the low k dielectric layer of the workpiece. The layer can be, for instance, a photoresist layer. The photoresist layer can be exposed to a light in conjunction with a mask to create a hard mask for future semiconductor processing, such as etch processing.

Figure 5:
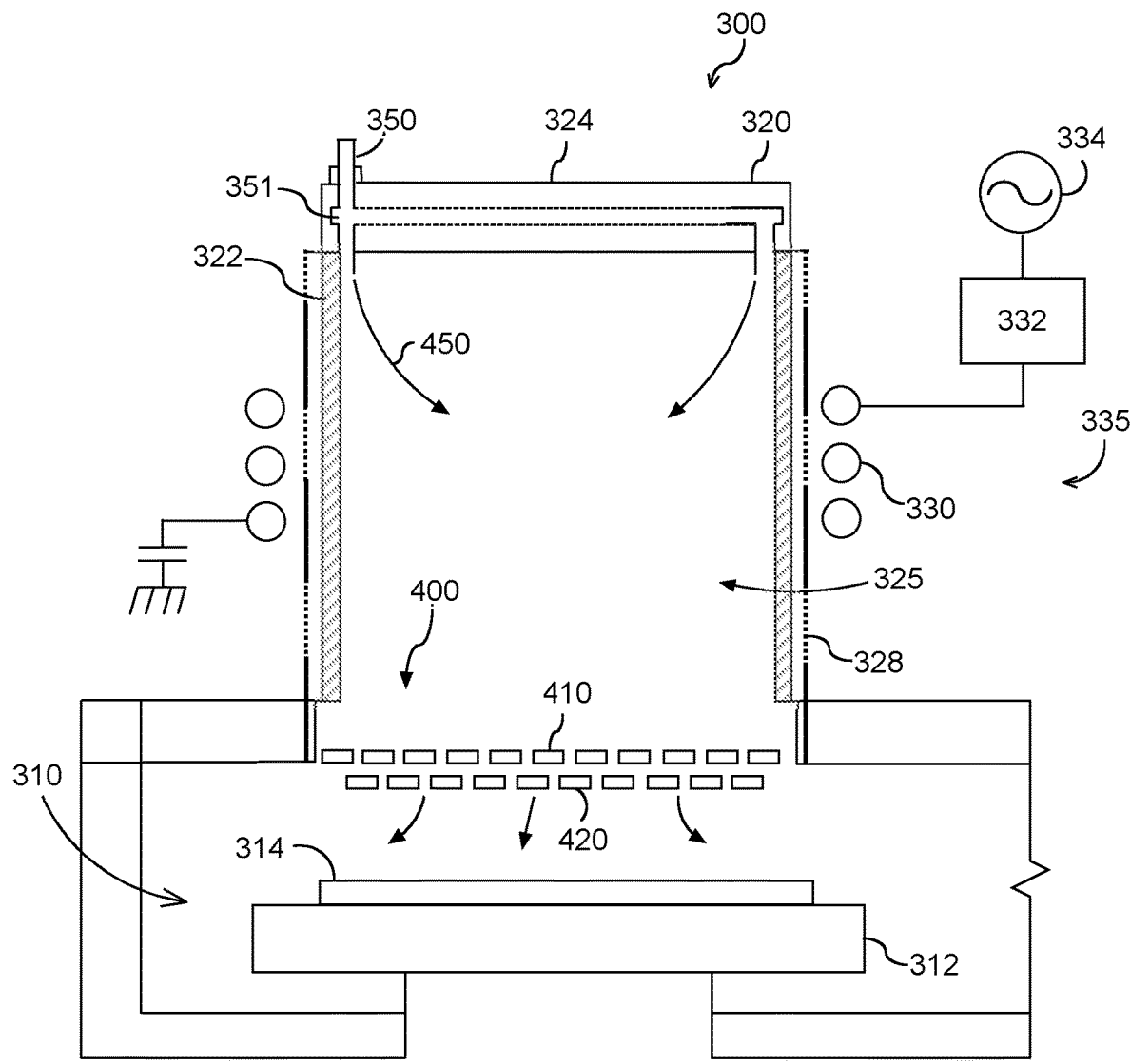
FIG. 5 depicts an example processing chamber configured to implement a surface treatment process according to example embodiments of the present disclosure.

FIG. 5 depicts another example processing apparatus 300 that can be used to implement the surface treatment process according to example embodiments of the present disclosure. The processing apparatus 300 is a plasma processing apparatus with an inductively coupled plasma source. As illustrated, the plasma processing apparatus 300 includes a processing chamber 310 and a plasma chamber 320 that is separated from the processing chamber 310. The processing chamber 310 includes a substrate holder or workpiece support 312 operable to hold a workpiece 314 to be processed, such as a semiconductor wafer. In this example illustration, a plasma can generated in the plasma chamber 320 (i.e., plasma generation region) by an inductively coupled plasma source 335 and desired species are channeled from the plasma chamber 320 to the surface of workpiece 314 through a separation grid assembly 400.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 320 can include a dielectric side wall 322 and a ceiling 324. The dielectric side wall 322, the ceiling 324, and the separation grid 400 define a plasma chamber interior 325. The dielectric side wall 322 can be formed from a dielectric material, such as quartz and/or alumina. The inductively coupled plasma source 335 can include an induction coil 330 disposed adjacent the dielectric side wall 322 about the plasma chamber 320. The induction coil 330 is coupled to an RF power generator 334 through a suitable matching network 332. Process gases (e.g., reactant and/or carrier gases) can be provided to the chamber interior from a gas supply 350 and an annular gas distribution channel 351 or other suitable gas introduction mechanism. When the induction coil 330 is energized with RF power from the RF power generator 334, a plasma can be generated in the plasma chamber 320. In a particular embodiment, the plasma processing apparatus 300 can include an optional grounded Faraday shield 328 to reduce capacitive coupling of the induction coil 330 to the plasma.

As shown in FIG. 5, the separation grid 400 separates the plasma chamber 320 from the processing chamber 310. The separation grid 400 can be used to perform ion filtering from a mixture generated by plasma in the plasma chamber 320 to generate a filtered mixture. The filtered mixture can be exposed to the workpiece 314 in the processing chamber 310.

In some embodiments, the separation grid 400 can be a multi-plate separation grid. For instance, the separation grid 400 can include a first grid plate 410 and a second grid plate 420 that are spaced apart in parallel relationship to one another. The first grid plate 410 and the second grid plate 420 can be separated by a distance.

The first grid plate 410 can have a first grid pattern having a plurality of holes. The second grid plate 420 can have a second grid pattern having a plurality of holes. The first grid pattern can be the same as or different from the second grid pattern. Charged particles can recombine on the walls in their path through the holes of each grid plate 410, 420 in the separation grid 400. Neutrals (e.g., radicals) can flow relatively freely through the holes in the first grid plate 410 and the second grid plate 420. The size of the holes and thickness of each grid plate 410 and 420 can affect transparency for both charged and neutral particles.

In some embodiments, the first grid plate 410 can be made of metal (e.g., aluminum) or other electrically conductive material and/or the second grid plate 420 can be made from either an electrically conductive material or dielectric material (e.g., quartz, ceramic, etc.). In some embodiments, the first grid plate 410 and/or the second grid plate 420 can be made of other materials, such as silicon or silicon carbide. In the event a grid plate is made of metal or other electrically conductive material, the grid plate can be grounded. In some embodiments, the separation grid 400 includes a single grid plate. In some embodiments, the separation grid includes three or more grid plates.

In some embodiments, the method of FIG. 2 can be implemented using the plasma processing apparatus 300 of FIG. 5. For instance, a workpiece 314 can be placed on the workpiece support 312. The workpiece 314 can include, for instance, a silicon nitride layer and a low-k dielectric layer. The workpiece can be heated to a process temperature using, for instance, a temperature regulation system (not illustrated in FIG. 5), such as heaters in the workpiece support 312, fluid channels in the workpiece support 312, lamps, lasers, or other heat sources. A process gas 450 can be admitted into the processing chamber 310. The process gas can include an ozone gas. In some embodiments, the process gas can include an oxygen gas and/or a carrier gas, such as nitrogen or an inert gas.

The process gas 450 can be admitted from the gas distribution channel 351 into the plasma chamber 325. The process gas 450 can flow from the plasma chamber 325 through the separation grid 400 to the processing chamber 310 for exposure to the workpiece 314 according to example embodiments of the present disclosure. In this example embodiment, the separation grid 400 can act as a showerhead for distribution of the process gas 450 into the processing chamber 310 for uniform distribution of the process gas 450 relative to the workpiece 314.

Figure 6:
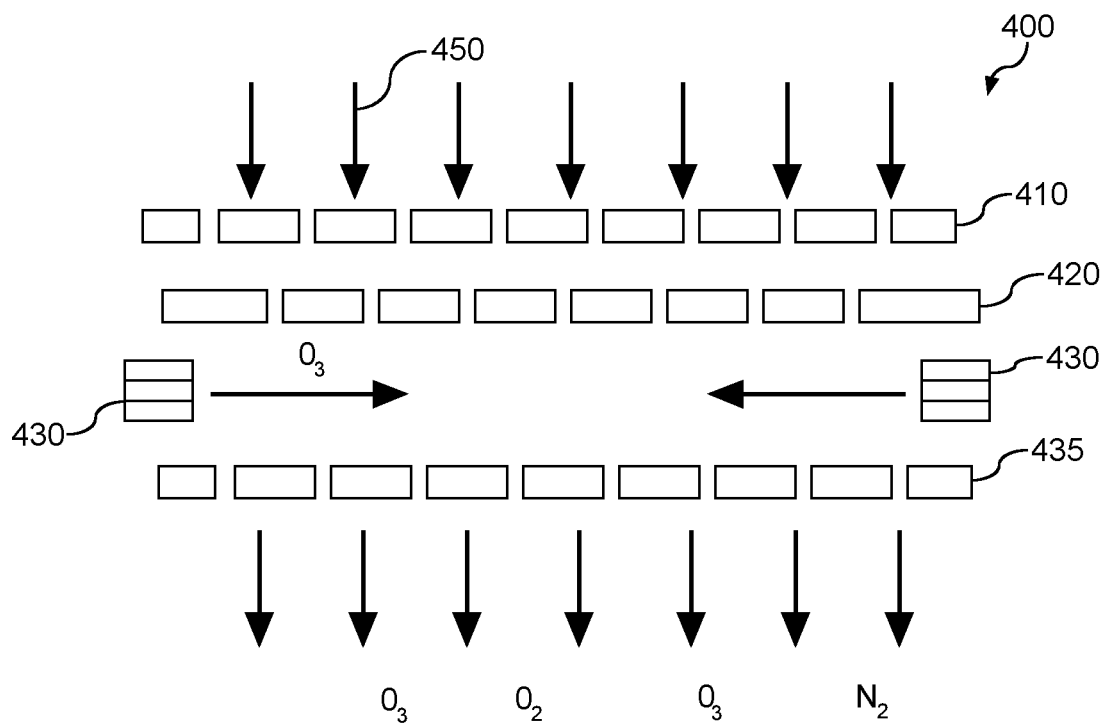
FIG. 6 depicts example injection of an ozone gas at a separation grid according to example embodiments of the present disclosure.

The process gas can be admitted into the chamber in other ways without deviating from the scope of the present disclosure, such as using gas injection ports at or below the separation grid 400. For instance, FIG. 6 depicts example injection of a process gas at a separation grid. according to example embodiments of the present disclosure. More particularly, the separation grid 400 includes a first grid plate 410 and a second grid plate 420 disposed in parallel relationship for ion/UV filtering.

The first grid plate 410 and a second grid plate 420 can be in parallel relationship with one another. The first grid plate 410 can have a first grid pattern having a plurality of holes. The second grid plate 420 can have a second grid pattern having a plurality of holes. The first grid pattern can be the same as or different from the second grid pattern. Subsequent to the second grid plate 420, a gas injection source 430 can be configured to admit a gas the separation grid. The gas can pass through a third grid plate 435 for exposure to the workpiece. In some embodiments, the gas injected from gas injection source 430 can be an ozone gas. The ozone gas can be injected into other components of a process gas (e.g., oxygen gas and/or carrier gas) passing through the separation grid 400. In some embodiments, the process gas (e.g., ozone gas, oxygen gas, and/or carrier gas) can be admitted into the separation grid 400 from the gas injection source 430.

The present example is discussed with reference to a separation grid with three grid plates for example purposes. Those of ordinary skill in the art, using the disclosures provided herein, will understand that more or fewer grid plates can be used without deviating from the scope of the present disclosure. In addition, the gas injection source 430 can be located at other locations relative to the separation grid 400, such as between the first grid plate 410 and the second grid plate 420, below the third grid plate 435, or below the entire separation grid 400. The gas injection source 430 can inject gas at any angle with respect to the separation grid 400.

Exposing the workpiece 314 to the process gas, including the ozone gas, can be used to modify the surface wetting angle of a silicon nitride layer on the workpiece 314. In some embodiments, the processing apparatus can be configured to conduct other surface treatment processes to treat other layers of the workpiece. For instance, a first surface treatment process (e.g., an ozone gas based surface treatment process) according to example aspects of the present disclosure can be used to modify a surface wetting angle of a silicon nitride layer on the workpiece 314 selectively relative to a low-k dielectric layer. A second surface treatment process (e.g., an organic radical based surface treatment process) can be used to modify a surface wetting angle of a low-k dielectric layer (e.g., SiOC layer) selectively relative to the silicon nitride layer. A third surface treatment process (e.g., a plasma based surface treatment process) can be used to modify a surface wetting angle of both the silicon nitride layer and the low-k dielectric layer.

Figure 7:
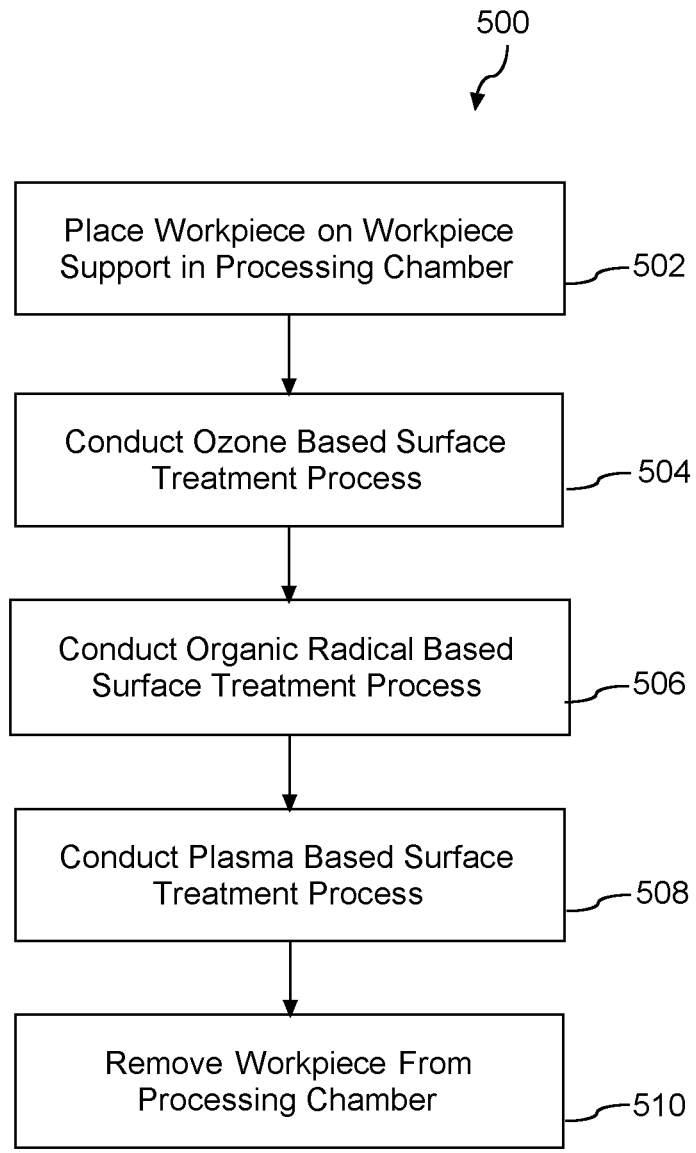
FIG. 7 depicts a flow diagram of an example method according to example embodiments of the present disclosure.

FIG. 7 depicts a flow diagram of an example method (500) according to example aspects of the present disclosure. The method (500) can be implemented using the plasma processing apparatus 300. However, as will be discussed in detail below, the organic radical based surface treatment processes according to example aspects of the present disclosure can be implemented using other approaches without deviating from the scope of the present disclosure. FIG. 7 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (502), the method can include placing a workpiece on a workpiece support (e.g., pedestal) in a processing chamber. The workpiece can be a semiconductor wafer. In some embodiments, the workpiece can include a silicon nitride layer and a low-k dielectric layer.

For instance, as shown in FIG. 5, a workpiece 314 can be placed on a workpiece support 312 in a processing chamber 310 separated from a plasma chamber 325 by a separation grid 400. The workpiece 314 can include at least a silicon nitride layer and a low-k dielectric layer (e.g., SiOC).

At (504) of FIG. 7, the method can include conducting an ozone-based surface treatment process to modify a surface wetting angle of the silicon nitride layer selectively relative to the low-k dielectric layer. The ozone-based surface treatment process can include exposing the workpiece to a process gas that includes an ozone gas. The ozone-based surface treatment process can include, for instance, one or more steps of surface treatment processes involving ozone gas described herein.

At (506), the method can include conducting an organic radical based surface treatment process (e.g., methyl radical based surface treatment process) to modify a surface wetting angle of the low-k dielectric layer selectively relative to the silicon nitride layer. The methyl radical based surface treatment process can expose the workpiece to methyl radicals (e.g., $CH_3$ radicals) that are generated using a plasma source.

For example, in one implementation, plasma source 335 can be used to induce a plasma in plasma chamber 325 from a process gas. The process gas can include one or more hydrocarbon molecules. Example hydrocarbon molecules can include, for instance, non-cyclic alkanes $C_nH_{2n+2}$ where n is greater than or equal to one and less than or equal to 10. For instance, the hydrocarbon molecules can include non-cyclic alkanes, such as methane $CH_4$, ethane $C_2H_6$, propane or iso-propane $C_3H_8$, etc. The hydrocarbon molecule(s) can include cyclic alkanes $C_nH_{2n}$, where n is greater than or equal to five and less than or equal to ten. For instance, the hydrocarbon molecule(s) can include cyclic alkanes such as cyclopentane $C_5H_{10}$, cyclohexane $C_6H_{12}$, methyl-cyclohexane $C_7H_{14}$, dimethyl-cyclohexane $C_8H_{16}$, 1,3,5-trimethyl-cyclohexane $C_9H_{18}$, etc. In some embodiments, the hydrocarbon molecule(s) can include alkenes $C_nH_{2n}$, where n is greater than or equal to one and less than or equal to ten, such as ethylene $C_2H_4$, propene $C_3H_6$, etc.

Radicals and ions generated in the plasma chamber 325 can pass through the separation grid 400 for ion filtering. In some embodiments, the one or more ions can be filtered using a separation grid 400 separating the plasma chamber 325 from the processing chamber 310 where the workpiece 314 is located. For instance, the separation grid 400 can be used to filter ions generated by the plasma. The separation grid 400 can have a plurality of holes. Charged particles (e.g., ions) can recombine on the walls in their path through the plurality of holes. Neutrals (e.g., radicals such as $CH_3$ radicals) can pass through the holes.

In some embodiments, the separation grid 400 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

The organic radicals passing through the separation grid can be exposed to the workpiece 314. The organic radicals (e.g., $CH_3$ radicals) can modify a surface wetting angle of the low-k dielectric layer (e.g., SiOC layer).

Other suitable surface treatment processes for exposing the workpiece to organic radicals can be used. For instance, a plasma can be generated in the plasma chamber 325 from an inert gas (e.g., helium gas) using the plasma source 335. Excited inert gas molecules can pass through the separation grid 400. A hydrocarbon gas can be injected into the excited inert gas molecules at or below the separation grid.

The hydrocarbon gas can include hydrocarbon molecules. Example hydrocarbon molecules can include, for instance, non-cyclic alkanes $C_nH_{2n+2}$ where n is greater than or equal to one and less than or equal to 10. For instance, hydrocarbon molecules can include non-cyclic alkanes, such as methane $CH_4$, ethane $C_2H_6$, propane or iso-propane $C_3H_8$, etc. The hydrocarbon molecule(s) can include cyclic alkanes $C_nH_{2n}$, where n is greater than or equal to five and less than or equal to ten. For instance, the hydrocarbon molecule(s) can include cyclic alkanes such as cyclopentane $C_5H_{10}$, cyclohexane $C_6H_{12}$, methyl-cyclohexane $C_7H_{14}$, dimethyl-cyclohexane $C_8H_{16}$, 1,3,5-trimethyl-cyclohexane $C_9H_{18}$, etc. In some embodiments, the hydrocarbon molecule(s) can include alkenes $C_nH_{2n}$, where n is greater than or equal to one and less than or equal to ten, such as ethylene $C_2H_4$, propene $C_3H_6$, etc.

Injection of the hydrocarbon molecules at or below the separation grid can generate one or more organic radicals, such as $CH_3$ radicals for exposure to the workpiece 314. The organic radicals can modify a surface wetting angle of a low-k dielectric layer on the workpiece 314.

At (508), the method can include conducting a plasma-based surface treatment process to expose the workpiece to one or more of oxygen radicals, hydrogen radicals, and/or nitrogen radicals to modify a surface wetting angle of both the silicon nitride layer and the low-k dielectric layer.

For example, in one implementation, plasma source 335 can be used to induce a plasma in plasma chamber 325 from a process gas to generate ions and one or more oxygen radicals, hydrogen radicals, and/or nitrogen radicals. Radicals and ions generated in the plasma chamber 325 can pass through the separation grid 400 for ion filtering. In some embodiments, the one or more ions can be filtered using a separation grid 400 separating the plasma chamber 325 from the processing chamber 310 where the workpiece 314 is located. For instance, the separation grid 400 can be used to filter ions generated by the plasma. The separation grid 400 can have a plurality of holes. Charged particles (e.g., ions) can recombine on the walls in their path through the plurality of holes. Neutrals (e.g., radicals such as one or more oxygen radicals, hydrogen radicals, and/or nitrogen radicals) can pass through the holes.

In some embodiments, the separation grid 400 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

The oxygen radicals, hydrogen radicals, and/or nitrogen radicals passing through the separation grid 400 can be exposed to the workpiece 314. The oxygen radicals, hydrogen radicals, and/or nitrogen radicals can modify a surface wetting angle of the low-k dielectric layer (e.g., SiOC layer) and the silicon nitride layer.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the workpiece comprising a semiconductor material, the workpiece comprising a first layer and a second layer, the process comprising:

placing the workpiece on a workpiece support in a processing chamber;

admitting a process gas into the processing chamber, the process gas comprising an ozone gas;

simultaneously exposing the first layer and the second layer to the process gas to decrease a surface wetting angle of the first layer by at least about 5°, wherein a surface wetting angle of the second layer is decreased by less than about 5°; and depositing a photoresist layer on the first layer;

wherein modifying the surface wetting angle of the first layer promotes adhesion of the photoresist layer across the first layer;

wherein the first layer is a silicon nitride layer and the second layer is a low-k dielectric layer, wherein the method comprises conducting an organic radical based surface treatment process on the workpiece to modify a surface wetting angle of the low-k dielectric layer selectively relative to the silicon nitride layer.

2. The method of claim 1, wherein the low-k dielectric layer is an SiOC layer.

3. The method of claim 1, wherein the ozone gas is admitted through a separation grid separating a plasma chamber from the processing chamber.

4. The method of claim 3, wherein the ozone gas is admitted through one or more gas injection ports into the separation grid.

5. The method of claim 1, wherein the ozone gas is admitted from a gas injection port located below a separation grid separating the processing chamber from a plasma chamber.

6. The method of claim 1, wherein exposing the first layer and the second layer to the process gas to modify a surface wetting angle of the first layer occurs when the workpiece is at a processing temperature, the processing temperature in a range of about 25° C. to about 500° C.

7. The method of claim 6, wherein the processing temperature is in a range of about 150° C. to about 500° C.

8. The method of claim 1, wherein a concentration of ozone gas in the process gas is in a range of about 0.1% by weight to about 20% by weight.

9. The method of claim 1, wherein a concentration of ozone gas in the process gas is in a range of about 0.5% by weight to 5% by weight.

10. The method of claim 1, wherein the process gas comprises a carrier gas, the carrier gas being one or more of nitrogen or an inert gas.

11. The method of claim 1, wherein the process gas comprises an oxygen gas ($O_2$ gas).

12. The method of claim 1, exposing the first layer and the second layer to the process gas to modify a surface wetting angle of the first layer occurs for a process period, the process period being in a range of about 5 second to 600 seconds.

13. The method of claim 12, wherein the process period is in a range of about 3 seconds to 90 seconds.

14. The method of claim 1, wherein admitting a process gas into the processing chamber and exposing the first layer and the second layer to the process gas to modify a surface wetting angle of the first layer is implemented in a pulsed mode.

15. A method for processing a workpiece, the workpiece comprising a semiconductor material, the workpiece comprising a silicon nitride layer and a low-k dielectric layer, the process comprising:

placing the workpiece on a workpiece support in a processing chamber;

conducting an ozone based hydrophilic surface treatment process on the workpiece, the ozone based hydrophilic surface treatment process comprising:

admitting a process gas into the processing chamber, the process gas comprising an ozone gas;

simultaneously exposing the silicon nitride layer and the low-k dielectric layer to the process gas for a processing period while the workpiece is at a processing temperature to decrease a surface wetting angle of the silicon nitride layer by at least 5°, wherein the surface wetting angle of the low-k dielectric layer is decreased by less than about 5°; and depositing a photoresist layer on the silicon nitride layer;

wherein modifying the surface wetting angle of the silicon nitride layer promotes adhesion of the photoresist layer across the silicon nitride layer;

wherein a concentration of the ozone gas in the process gas is in a range of about 0.1% by weight to about 20% by weight;

wherein the processing temperature is in a range of about 25° C. to about 500° C.; and wherein the processing period is in a range of about 5 second to 600 seconds;

wherein the method comprises conducting an organic radical based surface treatment process on the workpiece to modify a surface wetting angle of the low-k dielectric layer selectively relative to the silicon nitride layer.

16. The method of claim 15, wherein the organic radical based surface treatment process comprises exposing the low-k dielectric layer to one or more methyl radicals.

17. The method of claim 15, wherein the method comprises conducting a plasma based surface treatment process on the workpiece to modify a surface wetting angle of both the silicon nitride layer and the low-k dielectric layer, the ozone based hydrophilic surface treatment process comprising exposing the workpiece to one or more hydrogen radicals, oxygen radicals, or nitrogen radicals.

* * * * *